United States Patent
Chang et al.

(10) Patent No.: US 10,219,401 B1
(45) Date of Patent: Feb. 26, 2019

(54) SWITCH-OFF DELAY DEVICE

(71) Applicant: QUANTA COMPUTER INC., Taoyuan (TW)

(72) Inventors: Hou-Hsien Chang, Taoyuan (TW); Chao-Jung Chen, Taoyuan (TW); Yaw-Tzorng Tsorng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/724,000

(22) Filed: Oct. 3, 2017

(51) Int. Cl.
G06F 9/4401 (2018.01)
H05K 7/14 (2006.01)
G06F 9/44 (2018.01)

(52) U.S. Cl.
CPC .......... *H05K 7/1489* (2013.01); *G06F 9/442* (2013.01); *H05K 7/1492* (2013.01)

(58) Field of Classification Search
CPC combination set(s) only.
See application file for complete search history.

(56) References Cited

U.S. PATENT DOCUMENTS

| | | | |
|---|---|---|---|
| 6,483,717 B1 | 11/2002 | Ives et al. | |
| 8,792,234 B2 * | 7/2014 | Carnevali | G06F 1/1632 361/679.41 |
| 9,003,626 B2 * | 4/2015 | Carnevali | G06F 1/1632 248/316.4 |
| 9,161,476 B2 * | 10/2015 | Doglio | H05K 7/1489 |
| 9,668,371 B1 * | 5/2017 | Strmiska | E05C 1/006 |
| 9,854,697 B2 * | 12/2017 | Schmidtke | H05K 7/1489 |
| 9,915,085 B2 * | 3/2018 | Strmiska | E05C 1/166 |
| 9,921,615 B2 * | 3/2018 | Chen | G06F 1/18 |
| 2003/0002261 A1 | 1/2003 | Berry et al. | |
| 2014/0084764 A1 * | 3/2014 | Doglio | H05K 7/1489 312/223.2 |
| 2016/0042768 A1 * | 2/2016 | Yang | G11B 33/128 403/322.4 |
| 2016/0179131 A1 * | 6/2016 | Chen | G06F 1/187 361/679.58 |
| 2016/0219744 A1 * | 7/2016 | Loparco | G06F 1/16 |
| 2016/0219745 A1 * | 7/2016 | Loparco | G06F 1/16 |
| 2016/0219747 A1 * | 7/2016 | Genest | H05K 7/1487 |

(Continued)

FOREIGN PATENT DOCUMENTS

| | | |
|---|---|---|
| CN | 101221459 A | 7/2008 |
| EP | 0660653 A1 | 6/1995 |
| TW | M306678 U | 2/2007 |

OTHER PUBLICATIONS

Extended European Search Report for EP Application No. 18153708.5, dated Sep. 4, 2018.

(Continued)

*Primary Examiner* — Lisa Lea-Edmonds
(74) *Attorney, Agent, or Firm* — Nixon Peabody LLP; Eduardo J. Quiñones; Zhou Lu

(57) ABSTRACT

The present invention provides a device for controlling the time period required to remove a server from a slot. The time period is sufficient for data to be saved from the server prior to power being shut off to the server and its removal from the slot. The device has an arm with a proximal end and a distal end. The arm is mounted for rotation about a first axis from a closed position to an open position. A mechanism applies a motive force to the arm to bias the arm to the open position.

20 Claims, 8 Drawing Sheets

(56) References Cited

U.S. PATENT DOCUMENTS

2016/0309609 A1* 10/2016 Genest ................. H05K 7/1487
2017/0329371 A1* 11/2017 Schmidtke ......... H05K 7/20736
2017/0331766 A1* 11/2017 Schmidtke ......... H05K 7/20736
2017/0332518 A1* 11/2017 Schmidtke ......... H05K 7/20736

OTHER PUBLICATIONS

Taiwanese Office Action for Application No. 106141219, dated Aug. 16, 2018, w/ First Office Action Summary.
Taiwanese Search Report for Application No. 106141219, dated w/ First Office Action Aug. 16, 2018.

* cited by examiner

SWITCH-OFF DELAY DEVICE

TECHNICAL FIELD

A device for delaying the time period for removing a blade server from a slot until data on the blade server is saved by a computer network is disclosed.

BACKGROUND

Computer systems implemented by networked blade servers positioned in spaced slots in an enclosure are well known. From time to time blade servers must be removed from their enclosures for servicing or replacement. In such a process, data is transferred from the replaced blade server to configure the replacement blade server. If the blade server is removed too quickly, data in the server can be irretrievably lost. Accordingly, the present disclosure provides a device for delaying the removal of a blade server until it is safe to do so after a data transfer has been completed from the blade server.

SUMMARY

A device for controlling the time period required to remove a blade server from a slot is disclosed. The time period is sufficient for data to be saved from the blade server prior to power being shut off to the blade server and its removal from the slot. The device has an arm with a proximal end and a distal end. The arm is mounted for rotation about a first axis from a closed position to an open position. A motive force is applied to the arm to bias the arm to the open position. The device also has a latch moveable from a latched position to an unlatched position. When in the latched position, a portion of the latch engages a portion of the arm and resists rotation of the arm. When the latch is in the unlatched position the latch is not engaged to the arm to allow rotation of the arm about the first axis.

The device further includes a power circuit for providing electrical power to the blade server, when the arm is in the closed position the power circuit is closed and electrical power is provided to the blade server, and when the arm is in the open position the power circuit is open and no electrical power is provided to the blade server.

BRIEF DESCRIPTION OF THE DRAWINGS

To understand the present invention, it will now be described by way of example, with reference to the accompanying drawings and attachments in which.

DETAILED DESCRIPTION

Figure 1:
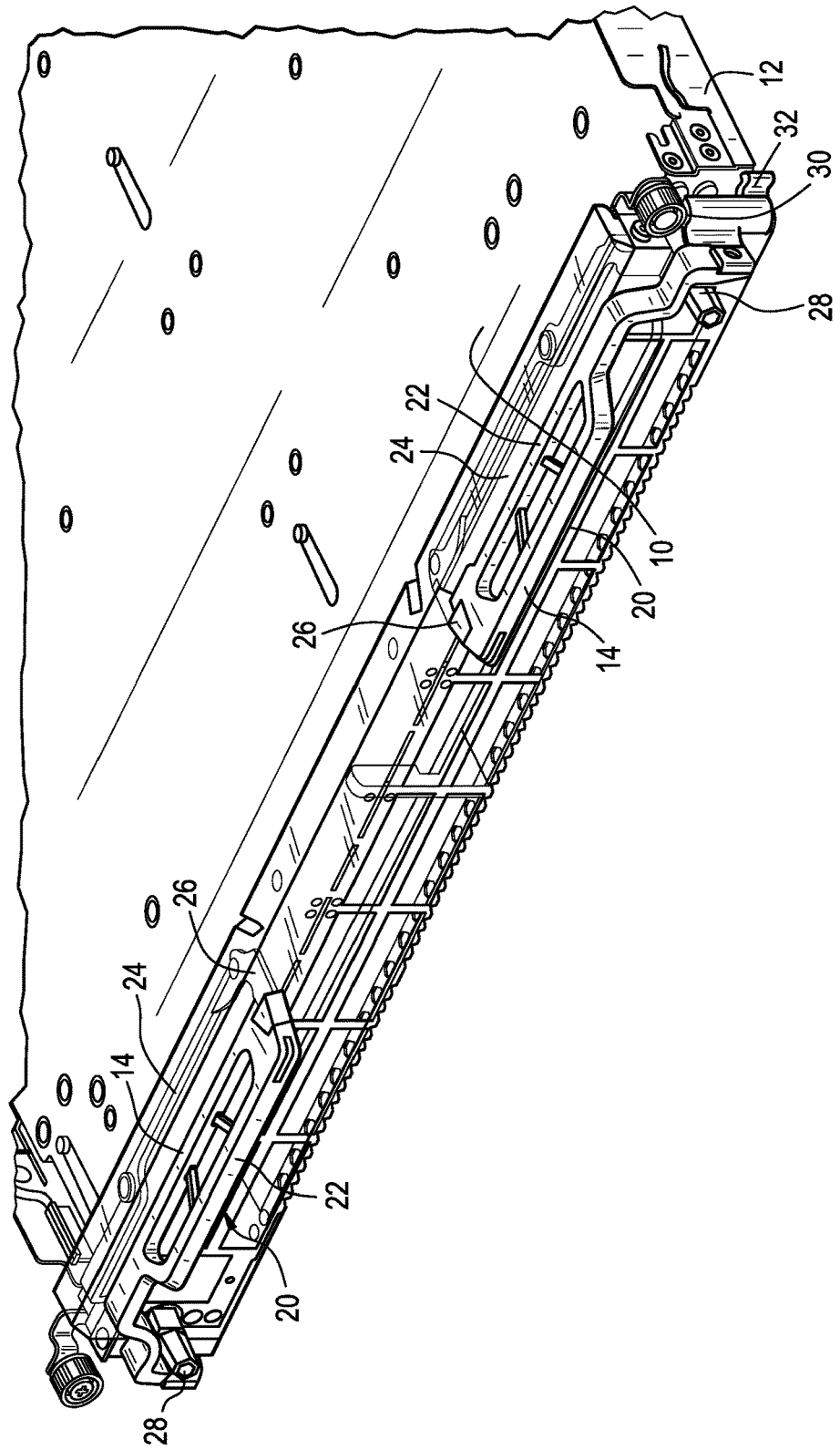
FIG. 1 is a perspective view of an example blade server in a slot with a switch-off delay device.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

FIG. 1 is a perspective view of a server 10 mounted in a slot 12 and electrically coupled to a computer network (not shown) and having a handle 14 for a user to grasp to pull the server 10 from the slot 12 and to disconnect it from an electrical power supply and the computer network. In one embodiment, the server 10 is a blade server 10 but could also be other types of servers well known to those of ordinary skill in the art. While the inventions will be described with reference to a "blade" server it should not be limited exclusively to this type of server. It is desirable to delay the removal of the blade server 10 for a sufficient time period to allow data on the blade server 10 to be transferred to the computer network before the electric power is cut off to the blade server 10. To this end, two switch-off delay devices 20 are mounted proximate the slot 12 and prevent removal of the blade server 10 for the period of time to allow the data from the blade server 10 to be transferred to the computer network before the electrical power supply is cut by movement of an arm as will be described.

The switch-off delay device 20 has an arm 22, a linkage 24, a latch 26, and an activator mechanism 28. FIG. 1 shows two switch-off delay devices 20, but it is contemplated that a single device would be adequate. However, two such devices are preferred in the event that one of the switch-off delay devices 20 malfunctions the other will serve as a redundancy. Since the two devices 20 are the same, a separate description of each is not necessary.

The switch-off delay device 20 has a damper mechanism 30, a tensioning mechanism 32 and a switch 34. The damper mechanism 30 resists the movement of the arm 22 toward an open position for a sufficient period of time for data to be saved from the blade server 10. The tensioning mechanism or device 32 biases the arm 22 toward an open position. The switch 34 is moveable from an "on" to an "off" position in response to movement of the arm 22. When in the on condition, an electrical power circuit (not shown) supplies power to the blade server 10. When the switch 34 is in the off position, electrical power cannot flow to the blade server 10. The damper mechanism 30 ensures the switch 34 remains in an on condition for a desired period of time for data recovery to be complete.

Figure 2:
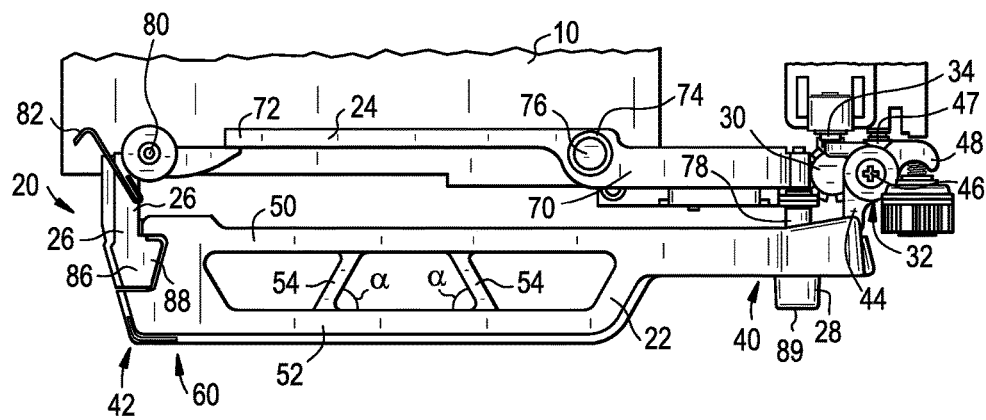
FIG. 2 is a top plan view of the switch-off delay device in a closed position.
Figure 3:
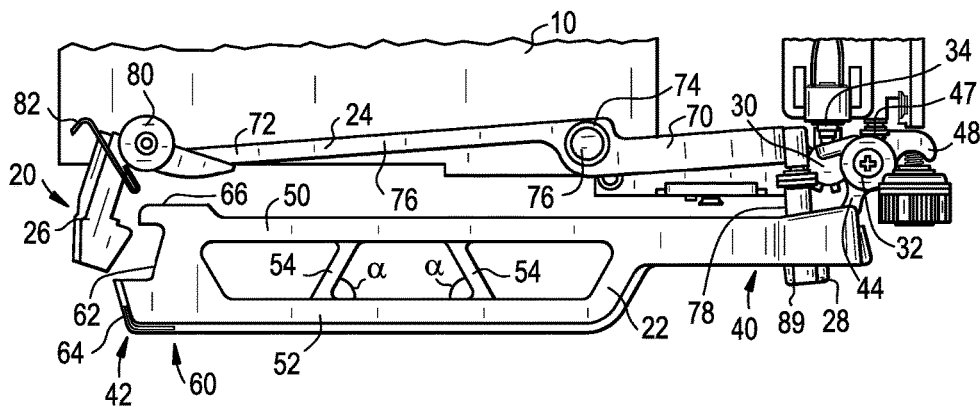
FIG. 3 is a top plan view of the switch-off delay device immediately after activation in a released position with a power circuit in a closed position and the arm unlatched.
Figure 4:
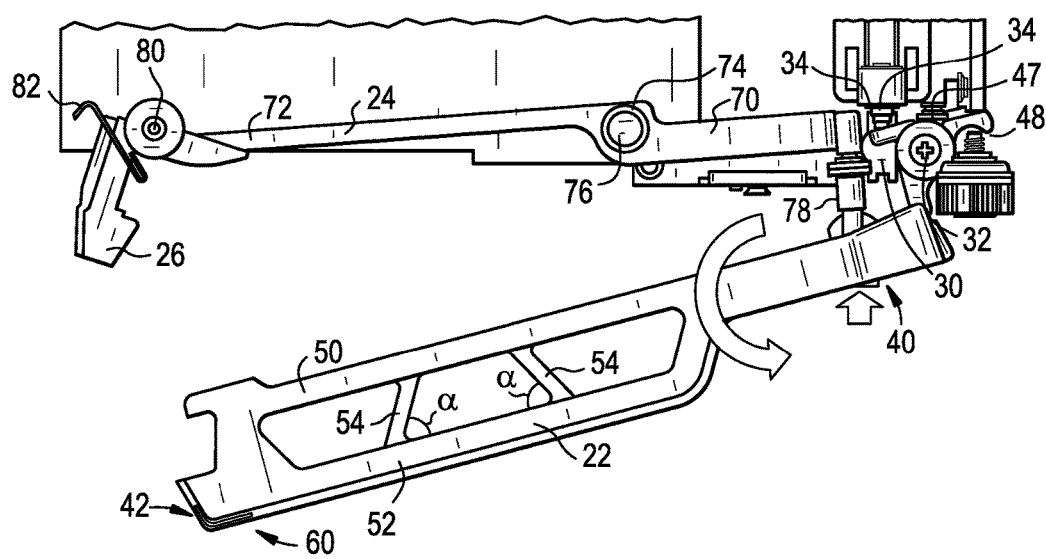
FIG. 4 is a top plan view of the switch-off delay device in an open position where the power circuit is in an open position.

FIG. 2 is a top plan view showing the switch-off delay device 20 with the latch 26 in a latched position, the arm 22 is in a closed position, and the switch 34 in an on condition. This condition of the device will sometimes be referred to as closed/on. FIG. 3 is a top plan view showing the switch-off delay device 20 with the latch 26 in an unlatched position, the arm 22 in a closed position, and the switch 34 in the on condition. This condition of the device will sometimes be referred to as released/on as shown in FIG. 3. FIG. 4 is a top plan view showing the switch-off delay device 20 with the latch 26 in an unlatched position and the switch 34 in an off condition. This condition of the device 20 will sometimes be referred to as open/off.

FIGS. 2-4 show the arm 22 has a proximal end 40 and a distal end 42. The arm 22 is generally elongate with a cross bar 44 extending from the proximal end. The cross bar 44 is mounted to an axle 46 for pivotal movement of the arm 22 between the closed position (FIG. 2) and the open position (FIG. 3). The cross bar 44 has a pair of flanges 47 and 48. Flange 47 engages the switch 34 when the device 20 is in the closed/on condition, and when the device 20 is in the released/on condition. The flange 47 is spaced from the switch 34 when the device is in the open/off condition. The hook 48 engages a flange on the server rack to lock it into the rack. As will be described below with reference to FIGS. 6-9, the hook 48 is moveable from a locked position to an unlocked position, and preferably by rotation about an axis through the hook 48.

A central portion of the arm 22 has two bars 50 and 52 spaced from one another with a gap therebetween. A pair of legs 54 spaced from one another extend from bar 50 to bar 52 through the gap and form an acute angle a with the bar 52. The arm 22 terminates in an enlarged section 60 having a generally C-shaped cutout 62 between a front jaw 64 and a rear jaw 66. The front jaw 64 extends axially outward from the arm 22 a greater distance than the rear jaw 66.

The linkage 24 has a proximal end 70, a distal end 72 and a step 74 at an intermediate portion thereof. The linkage 24 is mounted for pivotal movement about axle 76 at the intermediate portion. The proximal end 70 of the linkage 24 is in operative engagement with a rod 78 of the activator mechanism 28. The distal end 72 is in operative engagement with a portion of the latch 26. When a user presses the activator mechanism 28, the rod 78 moves inward to cause the distal end 72 of the linkage 24 to move downward (FIGS. 2-4) to cause the latch 26 to go from the latched position (FIG. 2) to the unlatched position (FIG. 3).

The latch 26 is generally L-shaped and is mounted for pivotal rotation about axle 80 and is biased by a motive force such as a spring 82 to the latched position (FIG. 2). A first end 84 of the latch 26 operatively engages the distal end 72 of the linkage 24. A second end 86 of the latch 26 has an enlarged portion having a projection 88 dimensioned to fit within the C-shaped cutout 62 of the arm 22 to prevent rotation of the arm 22 about axle 46.

The activator mechanism 28 has a first end 89 having a surface for pressing inward in the direction of the arrow (FIG. 3) of the device by a user. The rod 78 is mounted for reciprocating translational motion between an inactivated position (latched) to an activated position (unlatched). The rod 78 can be spring loaded to bias the rod 78 into the inactivated position. Alternatively, or in addition thereto, the linkage 24 can be spring loaded to return the linkage 24 and the activator mechanism 28 to the latched position (FIG. 2).

Figure 5:
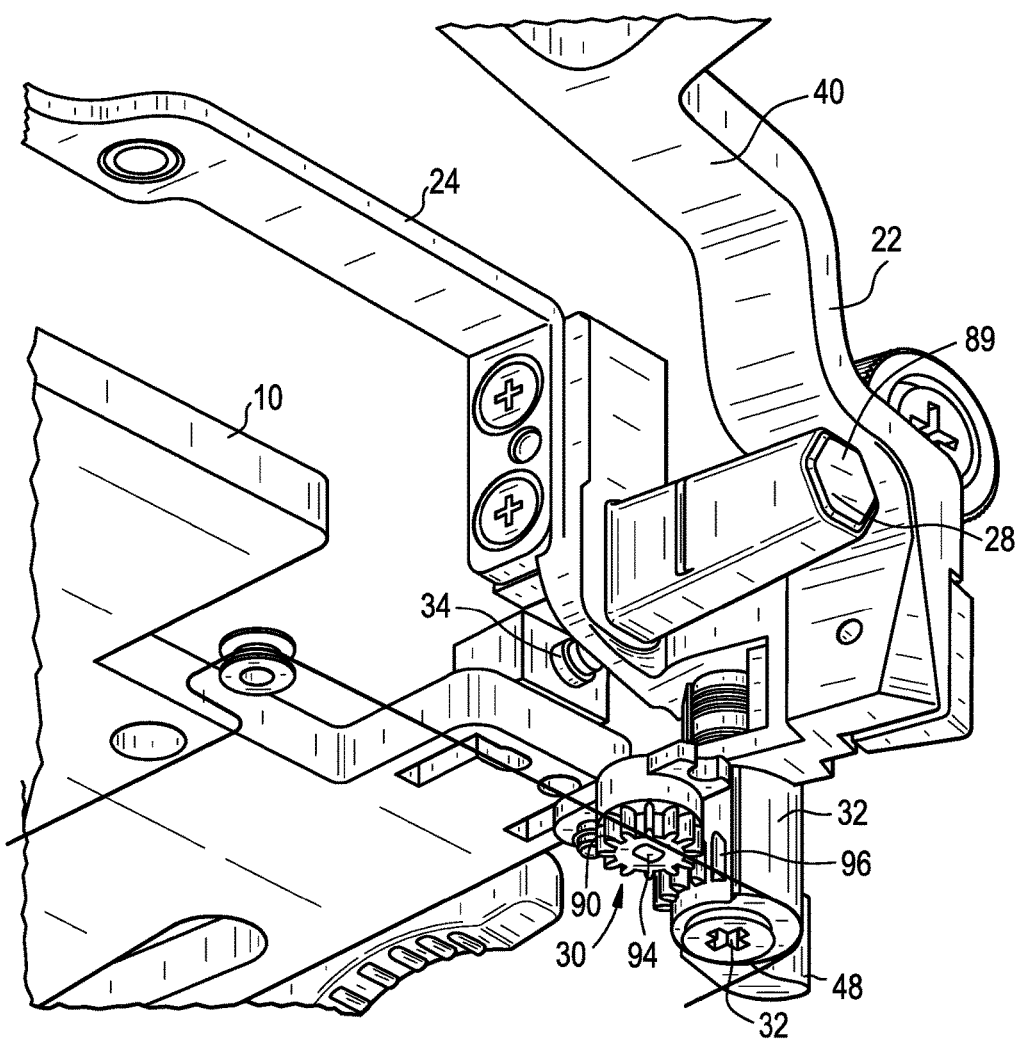
FIG. 5 is a perspective view of the switch-off delay device.

FIG. 5 is a perspective view of the switch-off delay device that includes the damper 30 and the tensioning mechanism 32. The damper 30 has a gear 90 with a plurality of teeth 92 spaced along the entire peripheral edge of the gear 90. The gear 90 is mounted for rotational motion about an axle 94. The gear 90 is biased to resist rotation. The tensioning mechanism 32 has an external surface supporting a plurality of teeth 96 that engage the teeth 92 of the gear. The tensioning mechanism 32 is biased by a spring 98 to rotate the arm 22 into the open position as shown in FIG. 2. The gear 94 has adequate resistance to rotation to ensure the period of time necessary to save the data from the blade server 10 is complete prior to the electrical power being switched off.

Figure 6:
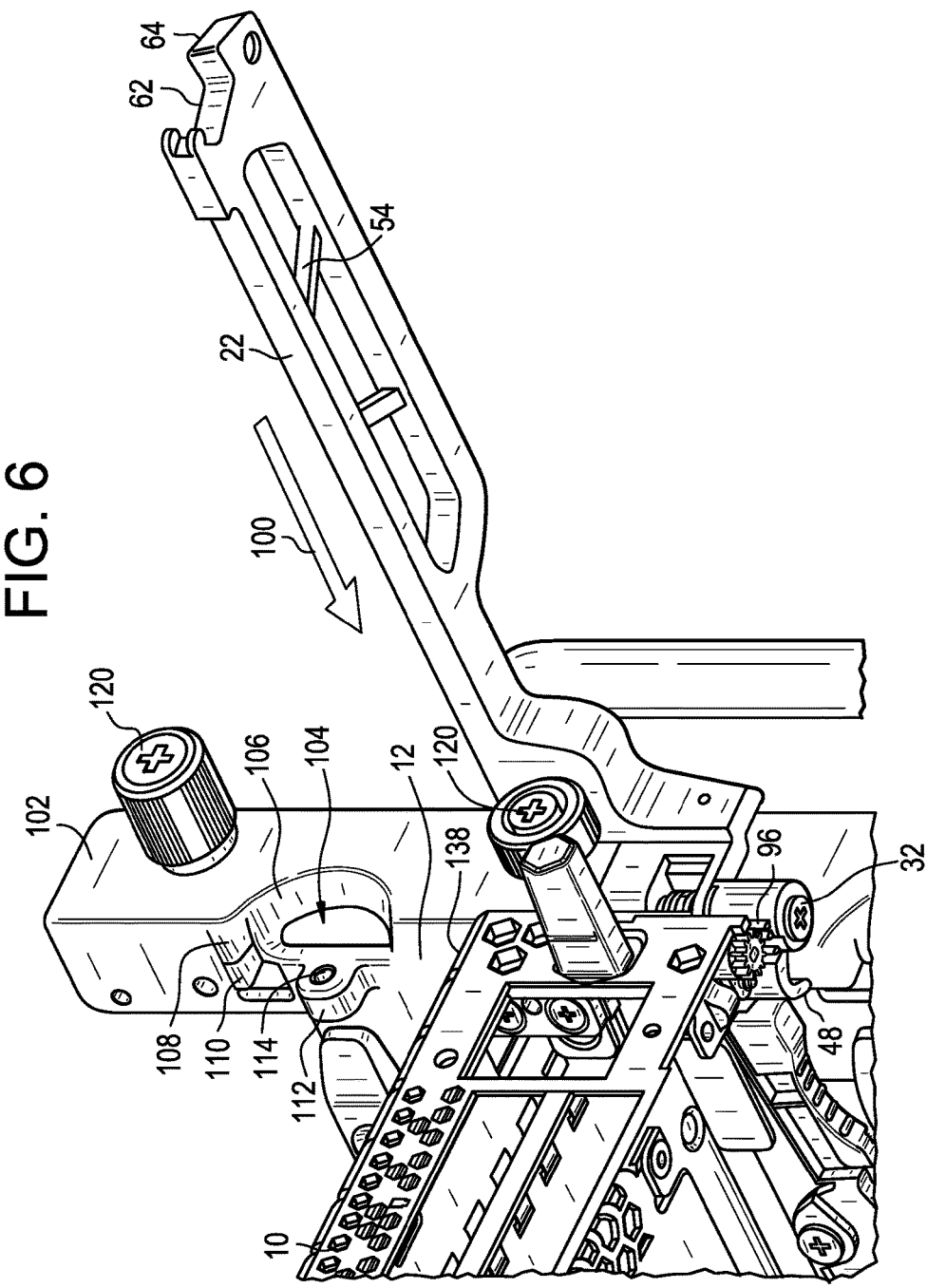
FIGS. 6-9 are perspective views of inserting a blade server into a slot of a server rack.

FIGS. 6-9 show a blade server 10 being inserted into a slot 12 of a server rack (not shown in its entirety). FIG. 6 shows the blade server 10 being moved in the direction of arrow 100 toward the server rack. The server rack has a mounting ear 102 with a plurality of vertically spaced slots 12 each associated with a docking member 104. In a preferred form of the invention, there will be a docking member 104 provided for each arm 22. Preferably there will be a docking member 104 on an opposed mounting ear on an opposite side of the server rack at the opposite end of the blade server 10 so that two docking members 104 are associated with each server 10. The docking member 104 is for engaging a portion of the blade server 10 for locking and unlocking the blade server from the docking member. In the locked position, the blade server 10 cannot be removed from the slot 12 without damaging the blade server 10 or a portion thereof.

The docking member 104 has an arcuate shaped wall 106 having a flange 108 at a top end of the arcuate wall 106 with a through hole 110. When the server 10 is in a locked position, a portion of the hook 48 will be positioned in the through hole 110. An upstanding boss 112 is positioned adjacent the arcuate wall 106 and has a threaded hole 114 for receiving a threaded nut 120. To further lock the server 10 in the slot 12, the threaded nut 120 is threaded into the threaded hole 114 using, for example, a wrench 122.

Figure 7:
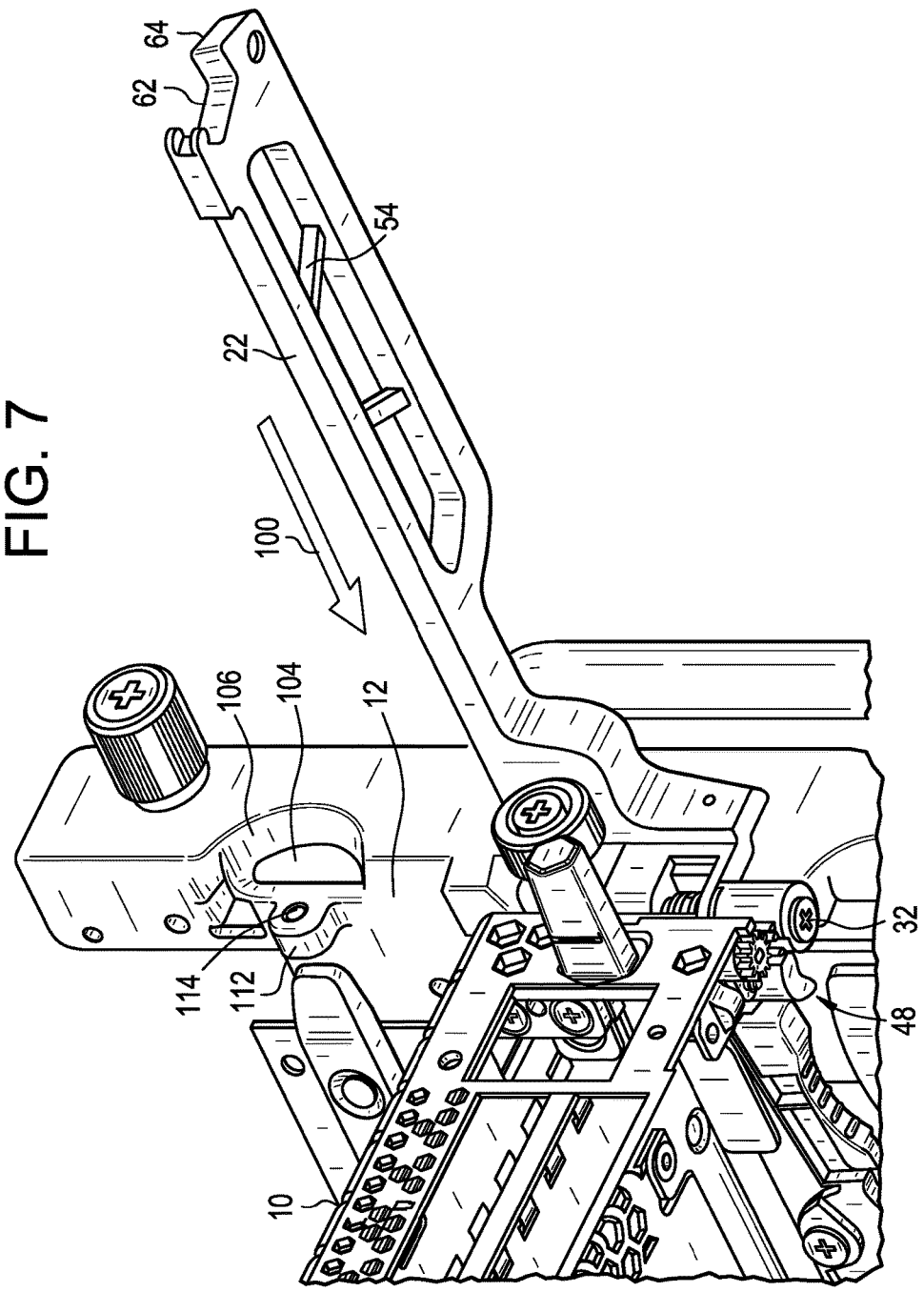

FIG. 6 shows the blade server initially being inserted into a slot 12 of the server rack in the direction of arrow 100 until a portion of the blade server abuts a portion of the server rack as shown in FIG. 7. The arm is disposed in a horizontal plane and extending perpendicularly from a front edge 130 of the blade server.

Figure 8:
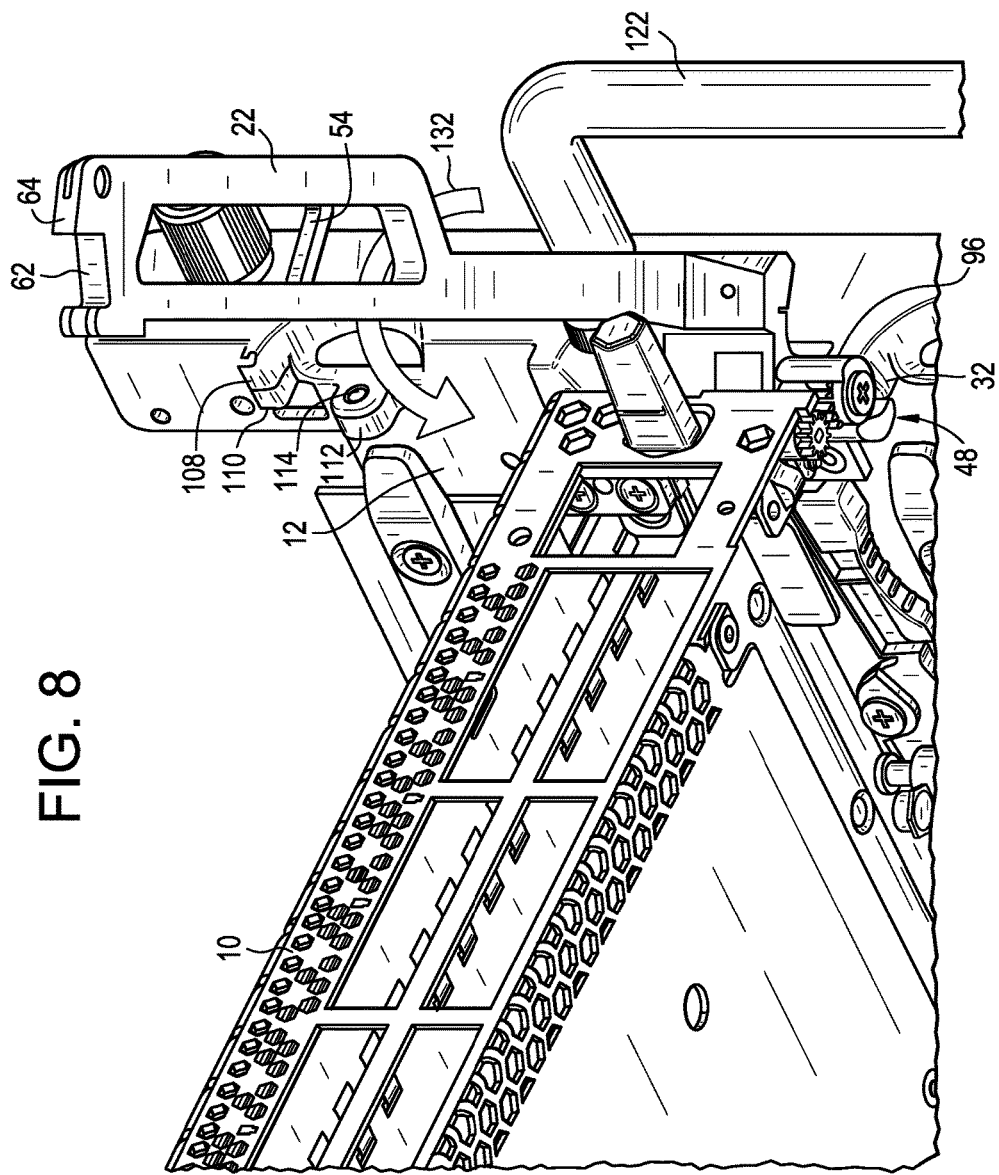
Figure 9:
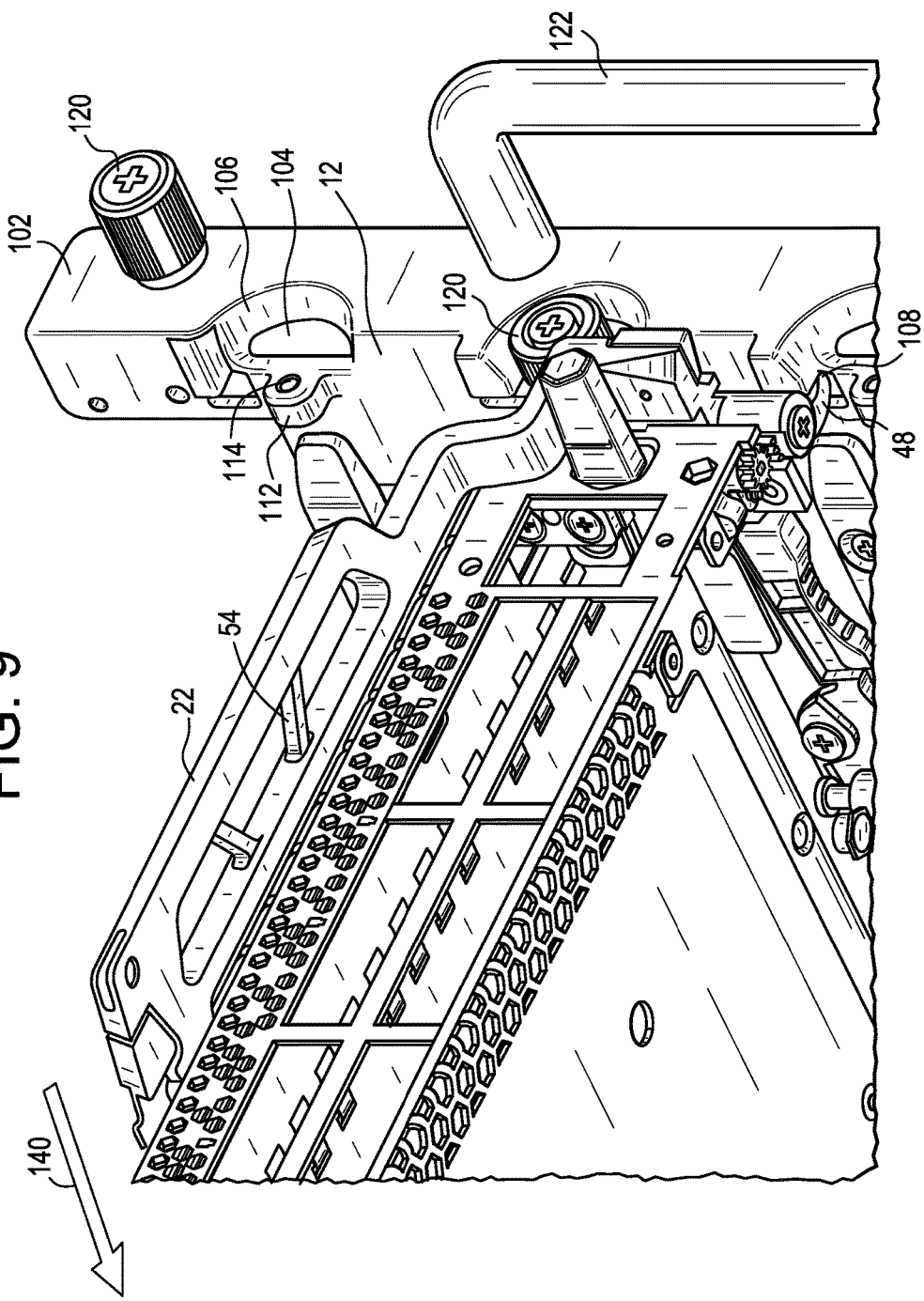

FIG. 8 shows the arm 22 rotating in the direction of arrow 132 about axle 46. This rotation causes the hook 48 to rotate into engagement with the flange 108 and the through hole 110 to pull, like a ratchet, the blade server in the direction of the arrow 140 (FIG. 9) where the server is shown in a locked position. FIG. 9 also shows the wrench 122 being moved into position to secure the threaded nut 120 into the threaded hole 114.

To remove a blade server from the server rack using the device 20, starting with the arm 22 in the latched position (FIG. 2), the arm 22 is secured from rotation about axle 46 by the latch 26, and the linkage biases the switch 34 in the on condition. When a user wishes to remove the blade server 10 from the slot 12, he or she will press the surface 89 inwardly in the direction of the arrow causing the rod 78 to rotate the linkage about axle 76 causing the distal end 72 of the linkage 24 to cause the latch 26 to rotate about axle 80. Now the device 20 is in the released/on condition as shown in FIG. 3. The computer network receives a signal to begin retrieving data from the blade server and saving the data. Now the arm 22 begins to open in response to the tensioning mechanism 32 and against the resistance of the gear 90. If the user pulls outwardly on the arm 22 to hasten the opening, the gear 90 will resist such efforts. The arm 22 will continue to rotate about the axle 46 and the linkage 24 will disengage from the switch 28 to allow the switch 34 to move to the open condition. Now the device 20 is in the open/off condition as shown in FIG. 3 where it is safe to remove the blade server 10. It is contemplated that some indicia is provided to the user that the blade server 10 can be removed such as by the flashing of a light or the sounding of a tone, for example.

Many modifications and variations of the present invention are possible in light of the above teachings. It is, therefore, to be understood within the scope of the appended claims the invention may be protected otherwise than as specifically described.

What is claimed is:

1. A device for controlling the time period required to remove a server from a slot comprising:
   an arm having a proximal end and a distal end and mounted for rotation about a first axis from a closed position to an open position;
   a tensioning mechanism for applying a motive force to the arm to bias the arm to the open position; and a latch moveable from a latched position to an unlatched position, when in the latched position a portion of the latch engages a portion of the arm and resists rotation of the arm, and when the latch is in the unlatched position the latch is not engaged to the arm to allow rotation of the arm about the first axis.

2. The device of claim 1 wherein the first axis is at the proximal end of the arm.

3. The device of claim 2 wherein the latch is mounted for pivotal movement about a second axis from the latched position to the unlatched position.

4. The device of claim 3 further comprising a linkage for moving the latch from the latched position to the unlatched position.

5. The device of claim 4 wherein the linkage is mounted for rotation about a third axis.

6. The device of claim 5 wherein the second axis and the third axis are parallel.

7. The device of claim 5 wherein the latch rotates about the second axis in a first direction when the linkage rotates about the third axis in a second direction opposite of the first direction when the arm moves between the open position and the closed position.

8. The device of claim 7 wherein the linkage has a proximal end and a distal end and the third axis is located at an intermediate portion.

9. A device for controlling the time period required to remove a server from a slot comprising:
- an arm having a proximal end and a distal end and mounted for rotation about a first axis from a closed position to an open position;
- a tensioning mechanism for applying a motive force to the arm to bias the arm to the open position;
- a latch moveable from a latched position to an unlatched position, when in the latched position a portion of the latch engages a portion of the arm and resist rotation of the arm, and when the latch is in the unlatched position the latch is not engaged to the arm to allow rotation of the arm about the first axis; and
a mechanism for initiating movement of the arm from the closed position to the open position.

10. The device of claim 9 wherein the mechanism for initiating comprises a rod having a proximal end and a distal end, the proximal end having a surface for a user to press, and the distal end of the rod engages the proximal end of the linkage.

11. The device of claim 10 further comprising a damper to resist the rotation of the arm about the first axis.

12. The device of claim 11 wherein the damper comprises a gear mounted for rotation about a fourth axis.

13. A device for controlling the time period required to remove a server from a slot comprising:
- an arm having a proximal end and a distal end and mounted for rotation about a first axis from a closed position to an open position;
- a tensioning mechanism for applying a motive force to the arm to bias the arm to the open position;
- a latch moveable from a latched position to an unlatched position, when in the latched position a portion of the latch engages a portion of the arm and resist rotation of the arm, and when the latch is in the unlatched position the latch is not engaged to the arm to allow rotation of the arm about the first axis; and
- a power circuit for providing electrical power to the server, when the arm is in the closed position the power circuit is closed and electrical power is provided to the server, and when the arm is an open position the power circuit is open and no electrical power is provided to the server.

14. The device of claim 13 wherein the power circuit is open before the arm is in an open position wherein the server can be removed from the slot.

15. The device of claim 14 wherein the period to time is sufficient for necessary data to be saved from the server prior to the removal of the server from the slot.

16. The device of claim 13 further comprising a mechanism for initiating movement of the arm from the closed position to the open position.

17. The device of claim 16 wherein the mechanism for initiating comprises a rod having a proximal end and a distal end, the proximal end having a surface for a user to press.

18. The device of claim 13 further comprising a damper to resist the rotation of the arm about the first axis.

19. The device of claim 18 wherein the damper comprises a gear mounted for rotation about a fourth axis.

20. The device of claim 13 wherein the mechanism for applying a motive force is a spring.

\* \* \* \* \*